United States Patent
Thieme et al.

(10) Patent No.: US 7,496,390 B2
(45) Date of Patent: Feb. 24, 2009

(54) LOW AC LOSS FILAMENTARY COATED SUPERCONDUCTORS

(75) Inventors: Cornelis Leo Hans Thieme, Westborough, MA (US); Martin W. Rupich, Framingham, MA (US); John D. Scudiere, Bolton, MA (US); Oleg A. Chevtchenko, Capelle aan den IJssel (NL)

(73) Assignee: American Superconductor Corporation, Devens, MA (US)

( * ) Notice: Subject to any disclaimer, the term of this patent is extended or adjusted under 35 U.S.C. 154(b) by 743 days.

(21) Appl. No.: 10/955,875

(22) Filed: Sep. 29, 2004

(65) Prior Publication Data
US 2006/0040830 A1 Feb. 23, 2006

Related U.S. Application Data

(60) Provisional application No. 60/603,202, filed on Aug. 20, 2004.

(51) Int. Cl.
*H01B 12/00* (2006.01)
*H01L 39/00* (2006.01)
*H01L 39/24* (2006.01)
*H01F 6/00* (2006.01)

(52) U.S. Cl. ............... 505/231; 505/230; 505/236; 505/237; 505/238; 505/431; 428/699; 428/701; 174/121.5; 29/599

(58) Field of Classification Search ......... 505/230–232, 505/236–238, 431, 887; 428/699, 701; 174/121.5; 29/599; 335/216, 296
See application file for complete search history.

(56) References Cited

U.S. PATENT DOCUMENTS

| 5,231,074 | A | | 7/1993 | Cima et al. |
| 5,683,967 | A | | 11/1997 | Frenkel |
| 5,908,812 | A | * | 6/1999 | Cotton et al. ............... 505/230 |
| 6,022,832 | A | | 2/2000 | Fritzemeier et al. |

(Continued)

FOREIGN PATENT DOCUMENTS

WO      WO-98/58415      12/1998

(Continued)

OTHER PUBLICATIONS

Glowacki, "Preparation of $Bi_2 Sr_2 CaCu_2 O_{8-x}$ tracks and thick films by jet printing", IOP Publishing Ltd. 2000, pp. 584-591.

(Continued)

*Primary Examiner*—Stanley Silverman
*Assistant Examiner*—Kallambella Vijayakumar
(74) *Attorney, Agent, or Firm*—WIlmer Cutler Pickering Hale & Dorr LLP.

(57) ABSTRACT

An article having low ac loss includes an elongated substrate having a length and a width; and a plurality of filaments comprising an oxide superconductor extending substantially along the length of the elongated substrate and spaced apart from one other filaments across the width of the elongated substrate, wherein at least one filament crosses over at least one other filament such that the at least one filament occupies a first position across the width of the elongated substrate before the crossover and a second position across the width of the elongated substrate after crossover.

30 Claims, 11 Drawing Sheets

U.S. PATENT DOCUMENTS

| | | | |
|---|---|---|---|
| 6,027,564 | A | 2/2000 | Fritzemeier et al. |
| 6,077,344 | A | 6/2000 | Schoup et al. |
| 6,190,752 | B1 | 2/2001 | Do et al. |
| 6,258,754 | B1 | 6/2001 | Sengupta |
| 6,399,154 | B1 | 6/2002 | Williams et al. |
| 6,436,317 | B1 | 8/2002 | Malozemoff et al. |
| 6,440,211 | B1 | 8/2002 | Beach et al. |
| 6,493,411 | B1 | 12/2002 | Chu et al. |
| 6,498,302 | B2 * | 12/2002 | Kaneko .................. 174/125.1 |
| 6,510,604 | B1 | 1/2003 | Pourrahimi |
| 6,525,002 | B1 | 2/2003 | Weinstein |
| 6,537,689 | B2 * | 3/2003 | Schoop et al. .............. 428/701 |
| 6,552,415 | B1 | 4/2003 | Paul et al. |
| 6,562,761 | B1 | 5/2003 | Fritzemeier et al. |
| 6,569,811 | B1 | 5/2003 | Shi |
| 6,602,588 | B1 | 8/2003 | Kwon et al. |
| 6,617,284 | B1 | 9/2003 | Rokhvarger et al. |
| 6,624,122 | B1 | 9/2003 | Holesinger et al. |
| 6,669,774 | B1 | 12/2003 | Zhang et al. |
| 6,673,387 | B1 | 1/2004 | Zhang et al. |
| 6,716,545 | B1 | 4/2004 | Holesinger et al. |
| 6,725,071 | B2 * | 4/2004 | Albrecht et al. ............. 505/231 |
| 6,765,151 | B2 | 7/2004 | Fritzemeier et al. |
| 6,797,313 | B2 | 9/2004 | Fritzemeier et al. |
| 6,893,732 | B1 | 5/2005 | Fritzemeier et al. |
| 6,918,172 | B2 | 7/2005 | Wong |
| 6,974,501 | B1 | 12/2005 | Zhang et al. |
| 2002/0056401 | A1 | 5/2002 | Rupich et al. |
| 2002/0178999 | A1 | 12/2002 | Beach et al. |
| 2005/0065035 | A1 | 3/2005 | Rupich et al. |
| 2007/0145100 | A1 | 6/2007 | Suzuki et al. |

FOREIGN PATENT DOCUMENTS

| | | |
|---|---|---|
| WO | WO-99/16941 | 4/1999 |
| WO | WO-99/17307 | 4/1999 |
| WO | WO-00/58044 | 10/2000 |
| WO | WO-00/058530 | 10/2000 |
| WO | WO-01/08169 | 2/2001 |
| WO | WO-01/08170 | 2/2001 |
| WO | WO-01/08231 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |

OTHER PUBLICATIONS

Creagh et al., "Design and Performance of Inkjet Print Heads for Non-Graphic-Arts Applications," MRS Bulletin, Nov. 2003, pp. 807-811.

Sirringhaus, et al., "Inkjet Printing of Functional Materials," MRS Bulletin, Nov. 2003, pp. 802-806.

Shimoda, et al., "Inkjet Printing of Light-Emitting Polymer Displays," MRS Bulletin, Nov. 2003, pp. 821-827.

Burns, et al., "Inkjet Printing of Polymer Thin-Film Transistor Circuits," MRS Bulletin, Nov. 2003, pp. 829-834.

Derby et al., "Inkjet Printing of Highly Loaded Particulate Suspensions," MRS Bulletin, Nov. 2003, pp. 815-818.

George A Levin, "Concept of Multiply Connected Superconducting Tapes," AFOSR MURI Workshop on Coated Conductors, Jan. 21, 2004, 38 pages.

Paul N. Barnes, PH.D., "AC Loss Reduction," AFOSR Review, Jan. 19-21, 2004, 16 pages.

American Superconductor Oak Ridge National Laboratory, "Low-Cost Fabrication of 2G Wire for AC Applications," SuperHyPe Program Review, Jan. 10, 2005, 12 pages.

U.S. Appl. No. 60/309,116, filed Jul. 31, 2001, Fritzemeier et al.
U.S. Appl. No. 60/477,613, filed Jun. 10, 2003.
U.S. Appl. No. 60/308,957, filed Jul. 31, 2001.
U.S. Appl. No. 60/166,297, filed Nov. 18, 1999.

Ashworth, et al., "AC Losses in Silver Clad $T_c$ Superconducting Tapes," Chinese Journal of Physics, 1996, vol. 34(2-11), pp. 232-242.

Babu, et al., "New Chemically Stable, Nano-Size Artificial Flux Pinning Centres in (RE)-Ba-Cu-O Superconductors," Superconductor Sci. and Tech., 2003, vol. 16, L44-L45.

Beach, et al., "Sol-Gel Synthesis of Rare Earth Aluminate Films as Buffer Layers for High $T_c$ Superconducting Films," Mat. Res. Soc. Symp. Proc., 1998, vol. 495, pp. 263-270.

Carr, et al., "Filamentary YBCO Conductors for AC Applications," I.E.E.E. Transactions on Applied Superconductivity, 1999, vol. 9(2), pp. 1475-1478.

di Uccio et al., "Phase Competition Between $Y_2BaCuO_5$ and $Y_2O_3$ Precipitates in Y-rich YBCO Thin Films," Physica C, 1999, vol. 321, pp. 162-176.

Gammel et al., Observation of Hexagonally Correlated Flux Quanta in $YBa_2Cu_3O_7$, Phys. Rev. Lett., 1987, vol. 59(22), pp. 2592-2595.

Glowacki, et al., "A New Method for Decreasing Transport AC Losses in Multifilamentary Coated Superconductors," Physica C, 2001, vol. 357-360., pp. 1213-1217.

Haugan et al., "Island Growth of $Y_2BaCuO_5$ Nanoparticles in $(211_{\sim 1.5nm/123} \sim_{10mn}) \times N$ Composite Multilayer Structures to Enhance Flux Pinning of $YBa_2Cu_3O_{7-\delta}$ Films," J. Mater. Res., 2003, vol. 18(11), pp. 2618-2623.

Huang, "Oxide Barriers and Their Effect on AC Losses of Bi,Pb (2223) Multifilamentary Tapes," 1998, Applied Superconductivity Conference.

Jin et al., "Superconducting Properties of $YBa_2Cu_3O_{7-67}$ with Partial Rare Earth Substitution," Physica C, 1991, vol. 173, pp. 75-79.

Kehl, "The Principles of Metallographic Laboratory Practice," Third Edition, 1949, McGraw-Hill Book Company.

Lee et al., "Alternative Buffer Architectures for High Critical Current Density YBCO Superconducting Deposits on Rolling Assisted Biaxially-Textured Substrates," Jpn. J. Appl. Phys., 1999, vol. 38, pp. L178-L180.

MacManus-Driscoll et al., "Strongly Enhanced Current Densitites in Superconducting Coated Conductors of $BaZrO_3$-Doped $YBa_2Cu_3O_{7-x}$," Superconductivity Tech. Center, Los Alamos Nat'l Lab., pp. 1-7.

Majoros, et al., "Modelling of the Influence of Magnetic Screening on Minimisation of Transport AC Losses in Multifilamentary Superconductors," I.E.E.E. Transactions on Applied Superconductivity, 2001, vol. 1(1), pp. 2780-2783.

Malozemoff, "Second Generation HTS Wire: An Assessment," 2004, American Superconductor Brochure.

Morrell et al., Sol-Gel Synthesis of Epitaxial Films of (Sr, Ba) $Bi_2(Nb,Ta)_2O_9$ and $Bi_4Ti_3O_{12}$ on [100] $SrTiO_3$, Mat. Res. Soc. Symp. Proc., 1998, vol. 495, pp. 271-276.

Oberly, et al., "AC Loss Analysis for Superconducting Generator Armatures Wound with Subdivided Y-Ba-$C_4$-O Coated Tape," Cryogenics, 2001, vol. 41, pp. 117-124.

Oomen, et al., "AC Loss in High-Temperature Superconducting Conductors, Cables, and Windings for Power Devices," Superconductor Science and Technology, 2004, vol. 17, pp. S394-S399.

Paranthaman et al., "Growth of Biaxially Textured $RE_2O_3$ Buffer Layers on Rolled-Ni Substrates Using Reactive Evaporation for HTS-Coated Conductors," Superconductor Sci. Tech., 1999, vol. 12, pp. 319-325.

Rupich et al., "Growth and Characterization of Oxide Buffer Layers for YBCO Coated Conductors," I.E.E.E. Trans. on Appl. Supercon., 1999, vol. 9(2), pp. 1527-1530.

Shoup et al., "Epitaxial Thin Film Growth of Lanthanum and Neodymiun Aluminate Films on Roll-Textured Nickel Using a Sol-Gel Method," J. Am. Cer.Soc., 1998, vol. 81, pp. 3019-3021.

Shakle "Crystal Chemical Substitutions and Doping of $YBa_2 Cu_3O_x$ and Related Superconductors," Materials Science and Engineering, 1998, vol. R23, pp. 1-40.

Wolf, et al., "Silicon Processing for the VLSI Era," 1986, vol. 1, pp. 539-574, Lattice Press, Sunset Park, CA.

Wu, et al., "Twin Boundaries and Critical Current Densities of YBa$_2$Cu$_3$O$_7$ Thick Films Fabricated by the BaF$_2$ Process," Superconductor Sci. and Tech., 2003, vol. 16, pp. 1127-1133.

Ashworth, Los Alamos National Laboratory, "AC Losses in Coated Conductors", Superconductivity for Electric Systems Annual Peer Review, Washington, DC, Jul. 27-29, 2004.

U.S. Patent and Trademark Office, "International Search Report", mailed Sep. 5, 2006, 3 pages.

U.S. Patent and Trademark Office, International Search Report mail Aug. 16, 2006, 3 pages.

* cited by examiner

C. E. Oberly, L. Long, G. L. Rhoads and W. J. Carr Jr, Cryogenics, 41, 117-124 (2001).

US 7,496,390 B2

LOW AC LOSS FILAMENTARY COATED SUPERCONDUCTORS

RELATED APPLICATIONS

This application claims the benefit of priority under 35 U.S.C. § 119(e) from copending U.S. Application Ser. No. 60/603,202, filed Aug. 20, 2004, and entitled "Dropwise Deposition Of A Patterned Oxide Superconductor," which is hereby incorporated in its entirety by reference.

This application is related to copending applications U.S. application Ser. No. 10/995,866, filed on event date herewith and entitled "Dropwise Deposition Of A Patterned Oxide Superconductor" and U.S. application Ser. No. 10/955,801, filed on event date herewith and entitled "Stacked Filamentary Coated Superconductors," which are hereby incorporated by reference.

STATEMENT AS TO FEDERALLY SPONSORED REASEARCH

This invention was made with the support of the United States government under Grant No. N00014-05-M-0050 awarded by the Office of Naval Research. The United States may have certain rights in the invention.

BACKGROUND

1. Field of the Invention

This invention relates to filamentary multilayer superconductor articles. The invention also relates to superconductor articles suitable for use in alternating current (ac) and time varying magnetic field applications.

2. Background of the Invention

Since the discovery of high-temperature superconducting (HTS) materials (superconducting above the liquid nitrogen temperature of 77 K) there have been efforts to develop various engineering applications using such HTS materials. In thin film superconductor devices and wires, significant progress has been made with fabrication of devices utilizing an oxide superconductor including yttrium, barium, copper and oxygen in the well-known basic composition of $YBa_2Cu_3O_{7-x}$ (hereinafter referred to as "YBCO"). Biaxially textured superconducting metal oxides, such as YBCO, have achieved high critical current densities in a coated conductor architecture, often referred to as second generation HTS wires, or a "coated conductor." The expression "HTS wire" indicates a HTS conductor with the attributes that make it useful for the construction of a superconducting device; its cross-sectional geometry can vary from tape-like to round.

Typically, second generation HTS wires 10 include a metal substrate 11, buffer layer(s) 12, and an active layer 13, e.g., a superconductor, as illustrated in FIG. 1. The metal substrate, such as Ni, Ag, or Ni alloys, provides flexibility for the article and can be fabricated over long lengths and large areas. The buffer layer(s) consists of metal oxide layers, such as $LaAlO_3$, $Y_2O_3$, $CeO_2$, or yttria-stabilized zirconia (YSZ); it makes up the next layer and serves as a chemical barrier layer between the metal substrate and the active layer. The buffer layer(s) reduces oxidation of the substrate and also reduces the diffusion of chemical species between the substrate and the superconductor layer. Moreover, the buffer layer(s) can have a coefficient of thermal expansion that is well matched with the superconductor material.

To achieve high critical current densities in the wire, the superconducting material has a sharp biaxial texture. As used herein, "biaxially textured" refers to a surface for which the crystal grains are in close alignment with a direction in the plane of the surface and a direction perpendicular to the surface. One type of biaxially textured surface is a cube textured surface, in which the crystal grains are also in close alignment with a direction perpendicular to the surface. Cube textured metal foils such as Ni or Ni alloys can serve as a substrate for high quality HTS wires.

When using a cube textured substrate the buffer layer is an epitaxial layer, that is, its crystallographic orientation is directly related to the crystallographic orientation of the substrate surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer.

Second generation HTS wire can be incorporated into a variety of devices for many applications, including cables, motors, generators, synchronous condensers, transformers, current limiters, and magnet systems. The incorporation of second generation superconducting YBCO wires into such devices provides the opportunity to dramatically reduce the device cooling requirements, thus enabling the development of lightweight, compact, high-power sources. Currently a wide, e.g., several millimeters, tape configuration is used to reach practical electrical currents.

Many potential applications for HTS wires involve operating the superconductor in the presence of ramped magnetic or oscillating magnetic fields, or require that the HTS wire carry alternating current. In the presence of time-varying magnetic fields or currents, there are a variety of mechanisms that give rise to energy dissipation, hereinafter referred to as "ac losses." Although second generation HTS wire is currently suitable for many types of electric power devices, including power transmission cables and rotor sections of motors, the ac losses from the current HTS wires are too high for use in demanding HTS applications in which the alternating magnetic fields have a higher amplitude or frequency. The use of an HTS wire with greatly reduced ac losses would enhance the application of these wires in a great variety of novel, HTS-based devices.

There are a number of factors contributing to the total ac loss in a superconducting wire, such as superconducting properties and dimensions of the superconducting oxide film, and the electrical and magnetic properties of the metal constituents of the conductor. A major contributor to the ac losses is so-called hysteretic losses in the superconducting oxide film caused by an oscillating external magnetic field. This loss contribution is proportional to the film width as seen by the magnetic field direction, and is therefore greatest when the magnetic field is perpendicular to the film surface, or when the alternating magnetic field has a large perpendicular component. For current HTS superconductor widths even a moderate ac frequency and magnetic field perpendicular to the superconducting film plane can produce very large ac losses. It has been proposed to divide an oxide superconducting film into narrow filaments to suppress ac loss in a superconducting oxide thin film.

FIG. 2A is a perspective view of a portion of a coated conductor article in which the superconducting film is arranged as a thin filament array. The multilayer article 20 includes a metal substrate 21 having a textured surface and epitaxially grown buffer layer(s) 22. Such textured bases have been previously described. A RABiTS™ (rolling-assisted, biaxially textured substrates) textured template is typically used. A RABiTS™ substrate is a roll-textured and annealed metal tape, e.g., nickel or nickel alloy such as NiW with a sharp cube texture, covered in an epitaxial manner with one or more oxide or metal buffer or conditioning layers. Another variation used to prepare the textured template is ion beam assisted deposition or IBAD. The resulting textured base serves as a template for the HTS compound, e.g., yttrium-barium-copper-oxide (YBCO). Superconductor filaments 23 run substantially continuously along the length of the base to form an array of substantially parallel filaments. The superconducting filaments are crystallographically oriented and typically exhibit biaxial texture.

SUMMARY OF THE INVENTION

In one aspect, the present invention provides low ac loss filamentary coated superconductors.

In one aspect of the invention, an article includes an elongated substrate having a textured surface and having a length and a width, and a plurality of filaments including an oxide superconductor extending substantially along the length of the elongated substrate and spaced apart from one other filaments across the width of the elongated substrate. At least one filament crosses over at least one other filament such that the at least one filament occupies a first position across the width of the elongated substrate before the crossover and a second position across the width of the elongated substrate after crossover.

In one or more embodiments, the at least one filament is separated from the other filament at least at the location of crossover by an insulating or poorly conductive or medium to high resistivity material. The medium to high resistivity material can be selected from the group consisting of copper-nickel alloy, nickel alloys and stainless steel.

In one or more embodiments, multiple filaments cross over at least one other filament to form multiple crossover locations along the length of the elongated substrate.

In one or more embodiments, the article includes about 2 to about 100 filaments, and for example, the filaments have a width of about 50 to 1000 μm.

In one or more embodiments, the space between adjacent filaments is in the range of about 10 μm to about 100 μm, and the space between adjacent filaments can be an insulating or poorly conducting or medium to high resistivity material, and for example, the medium to high resistivity material is selected from the group consisting of copper-nickel alloy, nickel alloys and stainless steel, and for example, the poorly conductive material comprises amorphous rare earth-alkaline earth copper oxide or a conductive metal oxide.

In one or more embodiments, the distance along the length of the article between neighboring crossover locations is in the range of about 0.005 m to about 100, or about 0.2 m to about 10 m.

In one or more embodiments, a filament at a lower filament position at a lower edge of the elongated substrate crosses over the plurality of filaments and is directed to a top filament position at an upper edge of the elongated substrate, and the remaining filaments are shifted in the opposite direction across the width of the elongated substrate by about one filament position, and for example, the filaments shift is repeated periodically along the length of the elongated substrate.

In one or more embodiments, a pair of filaments exchange filament positions during crossover, or for example, multiple filament pairs exchange filament positions periodically along the length of the elongated substrate.

In one or more embodiments, the filaments are fully transposed, or the filaments are partially transposed, or the filaments are located substantially in the same layer.

In one or more embodiments, the crossover includes a conductive crossover bridge electrically connecting the at least one filament between its first and second position, and for example, the bridge is a superconductor or a normal conductor, or the bridge includes a composite strip comprising a normal conductor layer and an insulating or high resistivity layer.

In one or more embodiments, the superconducting component of the filament is discontinuous and the ends of the discontinuous superconductor filament are joined by a conductive crossover bridge, and for example, the bridge is in electrical contact with the discontinuous superconductor filament. The bridge can be bonded to each end of the discontinuous filament, and for example, the bond comprises a solder or a weld.

The article of claim 1, further comprising a cap layer disposed over the plurality of filaments.

In one or more embodiments, the article further includes a stabilizer layer disposed on the cap layer.

In another aspect of the invention, an article includes an elongated substrate having a length and a width, and a plurality of filaments comprising an oxide superconductor extending substantially along the length of the elongated substrate and spaced apart from one another across the width of the elongated substrate. The plurality of filaments is periodically shifted in the same direction across the width of the elongated substrate by about one filament width and wherein a filament at a lower edge of the elongated substrate is directed to a top filament position at an upper edge of the elongated substrate through a conductive bridge.

In one or more embodiments, the superconducting component of the filament is discontinuous and the ends of the discontinuous superconductor filament are joined by a conductive bridge.

In one or more embodiments, the article further includes a cap layer disposed over the plurality of filaments, and the article further can include a stabilizer layer disposed above the cap layer.

In another aspect of the invention, a method of making a multifilamentary article is provided. The method includes providing a layer of oxide superconductor or precursor thereof on a substrate, treating the layer to form filaments, wherein at least one of the filaments is discontinuous, and joining the ends of the discontinuous filament using a conducting crossover bridge.

In one or more embodiments, the bridge includes a composite strip comprising a normal conductor layer and an insulating or high resistivity layer, and the bridge is in electrical contact with the discontinuous superconductor filament. The bridge can be bonded to each end of the discontinuous filament, for example, by solder or a weld.

BRIEF DESCRIPTION OF THE DRAWING

The invention is described with reference to the following figures, which are presented for the purpose of illustration only and which are not intended to be limiting of the invention and in which like elements are indicated by the like numbers in all the figures.

DETAILED DESCRIPTION

Single superconductor layers can be patterned into multiple filaments to reduce local ac losses. Short sample testing shows a reduction in ac loss proportional to the reduction in conductor or filament width. In principle the filaments can be electrically isolated from each other and the absence of a conductive path would strongly reduce so-called interfilamentary coupling losses. However, there are several considerations that make this approach less practical. Even if a "perfect" conductor could be manufactured and patterned, the ends would still need to be soldered to the current injection points and filaments would be shorted. This would allow the formation of giant current loops through these ends.

Second generation HTS wire production is based on a variety of continuous reel-to-reel thin film deposition techniques, practiced over very long lengths as superconducting wires are needed in piece lengths that can reach 1000 meters. Small defects can locally disrupt current transfer, and their effect becomes more serious when the conductor width is reduced. In narrow filaments of, for example, 100 micrometer width, small defects can potentially seriously disrupt local current transfer and render the conductor useless when used in long lengths. A certain degree of current sharing capability between filaments is therefore desired to mitigate the effect of these small defects, allowing currents an alternative path in case of an occasional local current constriction.

Figure 1:
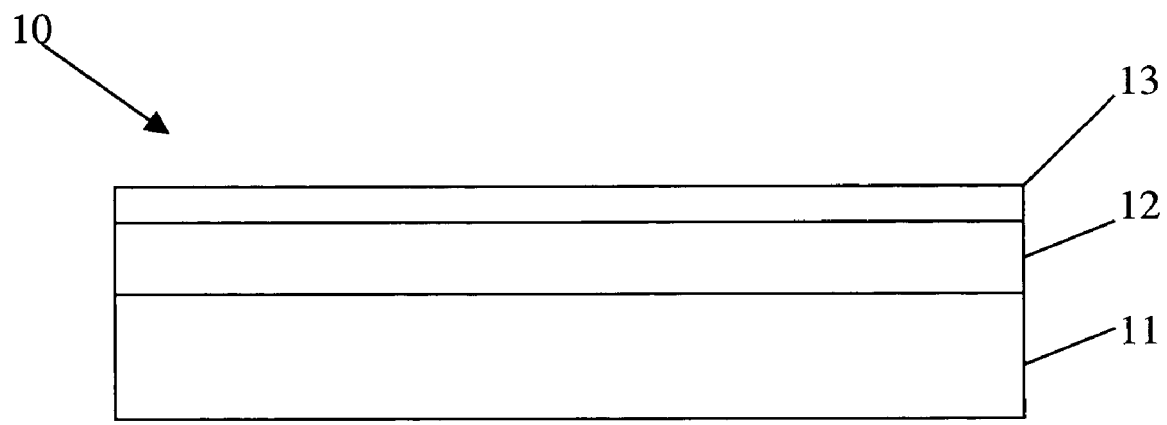
FIG. 1 is a cross-sectional view of a typical superconductor article.
Figure 2A:
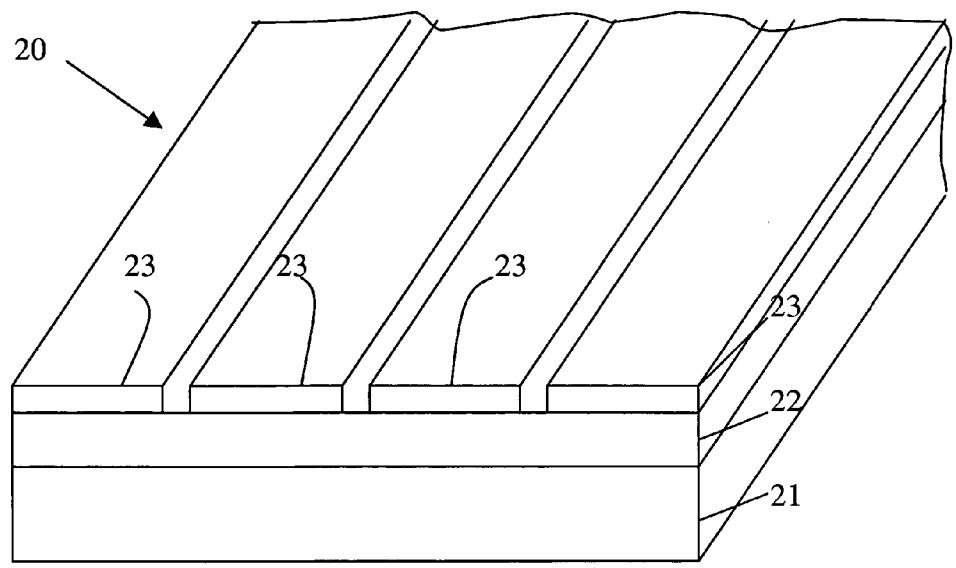
FIG. 2A is a perspective view of a coated conductor article, in which the YBCO film is arranged as a thin filament array.
Figure 2B:
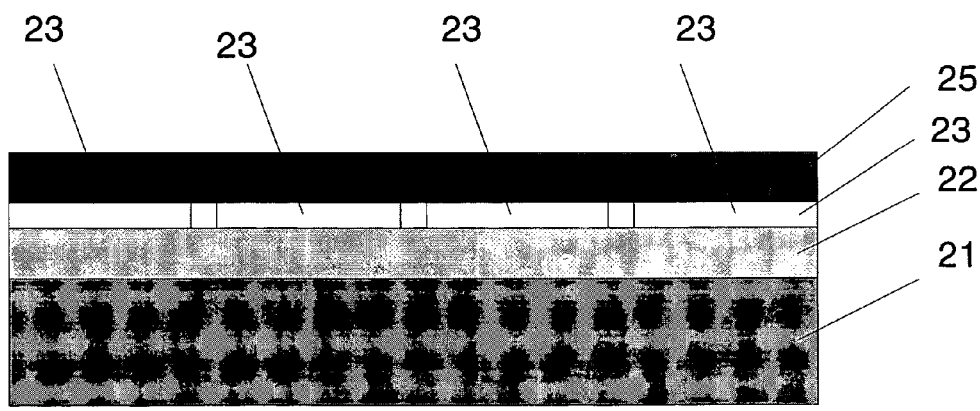
FIG. 2B is a cross-sectional view of a coated conductor article, in which the YBCO film is arranged as a thin filament array, with a common stabilizer layer.

A common stabilizer layer which is located on top of the superconducting filaments and which electrically connects the filaments can offer such a current sharing path. FIG. 2B illustrates a thin filament array 23 having a common stabilizer layer 25. The prime function of the stabilizer is to enhance the mechanical and electrical stability of the superconductor and offer a current path in along the length of the conductor in case of a local critical current depression. If used as a common stabilizer connecting individual filaments the electrical resistivity must be selected with care. Perpendicular alternating magnetic fields will cause circulating currents to pass through the superconductor filaments and perpendicular to the current direction, through the stabilizer to the next filament. When the loops become longer, currents through the normal conducting stabilizer will increase and the advantage of the filamentization is lost: the conductor has fully coupled filaments and losses can even exceed a conductor with a single, non-filamentized superconducting layer.

Figure 3:
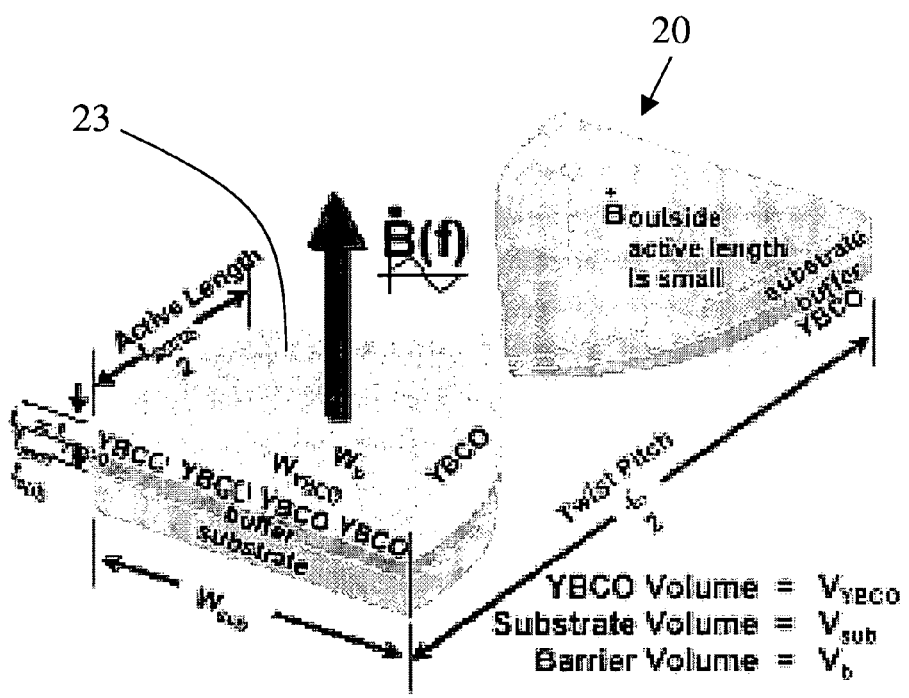
FIG. 3 is a schematic illustration of a twisted coated conductor with minimized ac loss.

An effective way to reduce the interfilamentary coupling losses is to select a stabilizer with enhanced electrical resistivity, and twist the superconducting wire. Both approaches have been used successfully in low temperature superconducting wires such as niobium-titanium wire. Twisting these small diameter round wires with a ductile superconductor is relatively easy. The thin filament arrays 23 of coated conductor 20 can in principle also be twisted to reduce coupling losses, as is illustrated in FIG. 3. The twist pitch must be long in order to avoid an unacceptable level of mechanical strain in the wire. Even low-strain twisting of less than 0.1% is difficult to accomplish and the twist pitch is very long, at the very least an order of magnitude higher than in low temperature superconductors, thereby limiting its effectiveness in reducing ac loss. Building a magnet using a twisted tape poses challenges as well, and uses the available space less effectively, thereby reducing the energy density of the device in a negative manner.

In one aspect of the invention, a low ac loss HTS coated conductor wire contains a number of parallel current path along the length of the wire having transpositions of the parallel paths, e.g., filament crossovers, at selected points. The parallel current paths are substantially electrically insulated from one another along the wire length, are transposed at selected points while retaining their electrical isolation, and are electrically connected to one another at the ends of the length of wire. In other embodiments, the filaments share current through a common stabilizer.

An exemplary superconducting article having reduced ac losses includes a wire having a textured surface and an array of superconducting oxide filaments extending substantially continuously along the length of the textured surface of the wire, wherein the filaments are substantially electrically and/or physically isolated from one another along their length. Periodic connections between adjacent filaments can be provided, however, to enhance current continuity from filament to filament and to offset defects that periodically arise in the superconducting material. Alternatively, the filaments are connected through a stabilizer layer bonded to the top of the filaments, with sufficient electrical resistivity to reduce interfilamentary coupling losses to an accepted level. The filaments are spaced apart from one another across the width of the elongated substrate and are patterned or arranged so that a filament periodically shifts across the width of the surface by one or more filament positions. The shifted filament crosses over at least one other filament to transpose the filaments and reduce the ac losses in long lengths of HTS coated wired without the need for twisting the wires. The filaments can be located substantially within the same plane or layer of the coated conductor (with the exception of the crossover).

By "crossover" it is meant that a filament shifts its position so as to pass from one side of a second filament to the other. The second filament may be stationary or it may also be shifted during crossover.

By "transposed" it is meant the transfer of one filament from an initial position into a position formerly occupied by another filament, where filament positions are defined as locations (coordinates) across the width of elongated substrate. The filament can shift positions, as exemplified in FIGS. 4 and 5, or a pair of filaments can exchange positions as exemplified in FIGS. 6 and 7. An article can be "fully transposed," by which is meant that each filament successively and repeatedly takes on every possible position on the elongated substrate in an equal manner. An article can be "partially transposed," by which is meant any filament configuration in which at least one filament takes on at least one other filament position on the elongated substrate. It is not required that all filaments take on multiple positions on the elongated filament or that they take on all positions on the elongated filament.

Figure 4:
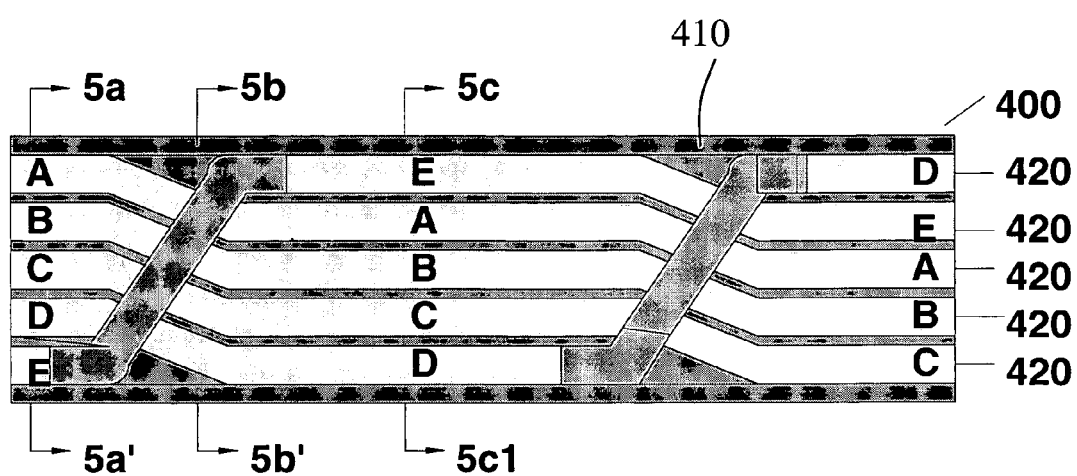
FIG. 4 is a top view of a low ac loss multifilamentary superconductor article illustrating periodic crossover of the filaments.
Figure 5C:
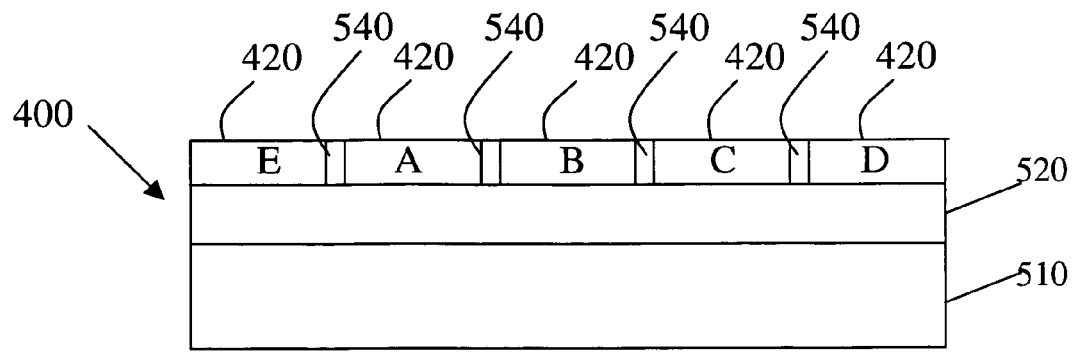
FIG. 5C is a cross-sectional view of the superconductor article of FIG. 4 taken at line 5c-5c'.
Figure 5B:
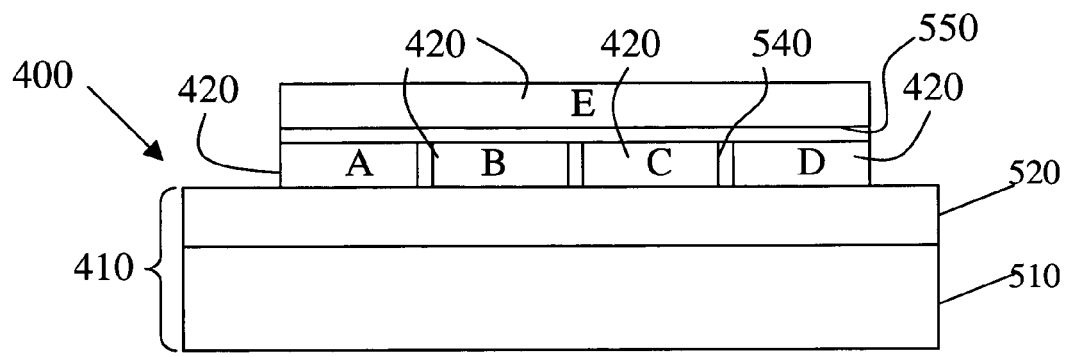
FIG. 5B is a cross-sectional view of the superconductor article of FIG. 4 taken at line 5b-5b'.
Figure 5A:
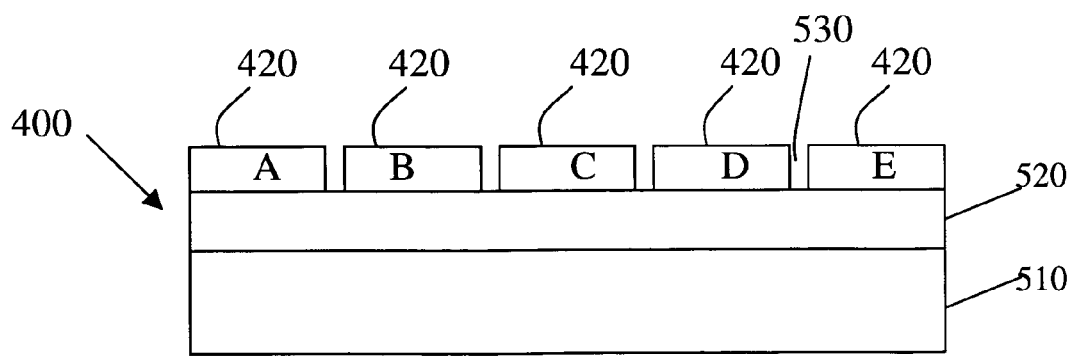
FIG. 5A is a cross-sectional view of the superconductor article of FIG. 4 taken at line 5a-5a'.

In one embodiment, a low ac loss wire includes fully transposed filaments, that is, each filament occupies every filament position in the article. FIG. 4 is a top view of a low ac loss multifilamentary coated HTS article 400. FIG. 5A-5C illustrate cross-sectional views of article 400 taken at lines 5a-5a', 5b-5b' and 5c'-5c', respectively. The coated article 400 includes a base 410 and an array of superconducting filaments 420 extending substantially continuously along the length of the article. For the purposes of illustration, the article includes five (5) filaments, however, any number of filaments may be used in practice. As indicated in FIGS. 5A-5C, the base 410 of the article 400 includes a metal substrate 510 having a textured surface and epitaxially grown buffer layer(s) 520. Such textured bases have been previously described. A RABiTS™ (rolling-assisted, biaxially textured substrates) textured template is typically used. A RABiTS™ substrate is a roll-textured and annealed metal tape, e.g., nickel, covered with one or more oxide or metal buffer or conditioning layers. Another variation used to prepare the textured template is ion beam assisted deposition or IBAD. Examples of buffer layer materials include metals and metal oxides, such as silver, nickel, MgO, $Al_2O_3$, $GaO_x$, rare earth oxides such as $Tb_2O_3$ $Gd_2O_3$, $CeO_2$, $Y_2O_3$, ternary compounds such as yttria-stabilized zirconia (YSZ), $LaAlO_3$, $SrTiO_3$, $LaNiO_3$, $LaCuO_3$, $SrRuO_3$, $NdGaO_3$, $NdAlO_3$ and nitrides as known in the art. The resulting textured base serves as a template for the HTS compound, e.g., yttrium-barium-copper-oxide (YBCO) or alternatively with a rare earth substituted for the Y.

At an initial position indicated by line 5a-5a' (and illustrated in cross-section in FIG. 5A), the filaments 420 are spaced apart from one another across the width of the substrate 410 in A-B-C-D-E order from the upper to the lower edge of the substrate. The array of filaments can have a gap between filaments in the range of about 10 to 100 µm, or for example, less than 50 µm. The filaments are typically about 50 to 1000 µm wide, or typically about 100 µm. In one or more embodiments, the filament array includes filaments of less than about 100 µm wide separated by a gap of about 10 to 20 µm.

At a crossover point indicated at line 5b-5b' in FIG. 4 and illustrated in cross-section in FIG. 5B, filaments A through D are shifted in one direction along the width (e.g., towards the lower edge) by a distance of about one filament position so that filament A is located at the position previously occupied by filament B prior to the shift, filament B is located at the position previously occupied by filament C prior to the shift, and so forth. Filament E shifts in the opposite direction and crosses over filaments A through D (e.g., towards the upper edge) to occupy the position previously occupied by filament A. The position of the filaments at the crossover point is shown in FIG. 5B, in which filaments A through D are located in some intermediate position between their original and final position and filament E crosses over the other filaments. The position of the filaments 420 after crossover is indicated by line 5c-5c' (and illustrated in FIG. 5C). The filaments 420 are now spaced apart from one another across the width of the substrate 410 in E-A-B-C-D order. Periodic crossovers occur along the length of the article. For example, an additional crossover is shown in FIG. 4, in which filament D crosses over filaments E-A-B-C resulting in a filament arrangement of D-E-A-B-C. Such periodic crossovers cause each filament to occupy every filament position in the article. Such a filament crossover pattern results in a "fully transposed" wire.

In one or more embodiments, the filaments are substantially electrically isolated from one another along their length. Electrical isolation may be accomplished in a number of ways. For example, an insulating air gap 530 may be maintained between adjacent filaments, as illustrated in FIG. 5A. By way of another example, a filler material 540 may be interposed between filaments, as illustrated in FIGS. 5B and 5C. Inclusion of a filler material 540 can contribute to the mechanical stability of the article and serves to electrically and/or mechanically isolate the filaments.

A filler material 550 can be interposed between the lower face 555 of the crossover filament and the upper faces 558 of the crossed over filaments. The filler material can be a poorly conducting, insulating or of medium to high resistivity. Exemplary insulating materials include ceramic materials such as barium zirconate or HTS superconductor that has been thermally decomposed or poisoned by the additional of a metal contaminant, e.g., zinc-contaminated YBCO or $PrBa_2Cu_3O_{7-x}$. $PrBa_2Cu_3O_{7-x}$ has the added advantage of having a lattice structure similar to that of YBCO, so that it can be textured in a manner similar to YBCO.

In one or more embodiments the filaments are not electrically insulated but are connected through a common stabilizer layer disposed above the filaments (not shown). To reduce interfilamentary coupling losses (currents run perpendicular to the wire or tape direction, from filament-to-filament, through the metal stabilizer) the stabilizer needs to have a medium to high resistivity. Medium to high resistivity is associated with reduced ac losses. Exemplary medium resistivity materials include, for example, brass, copper-aluminum bronze, copper-tin bronze, copper with around 10-40% nickel, with resistivities of around 5-40 mircroohm-cm at cryogenic temperatures. Exemplary high resistivity materials include, for example, copper with 40-50% nickel such as Constantan™, (resistivity of around 50 microohm-cm) and most commercial nickel alloys with substantial additions such as nickel-20% chromium, Hastelloy™, Inconel™, and most commercial stainless steels, with resistivities of around 100-120 microohm-cm at cryogenic temperatures.

Figure 6:
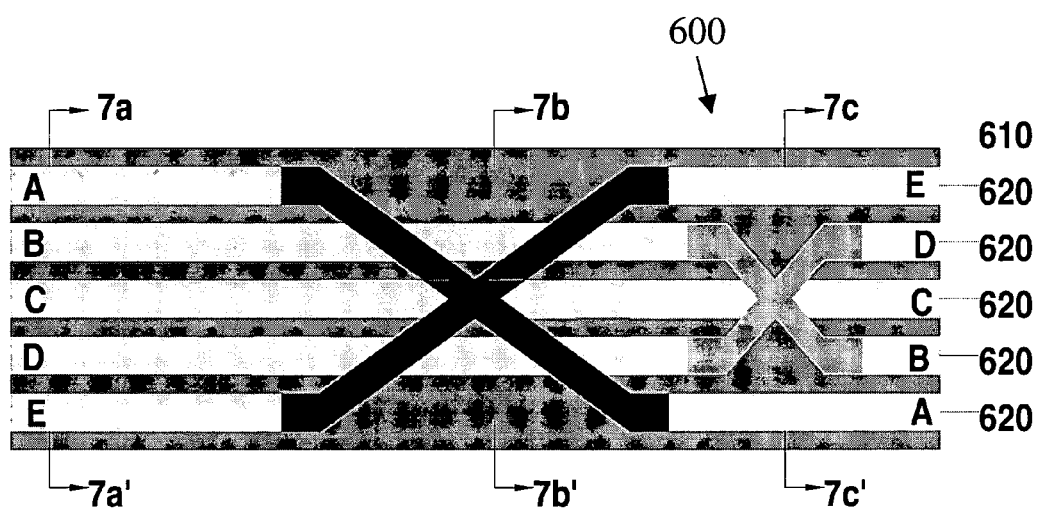
FIG. 6 is a top view of a low ac loss multifilamentary superconductor article illustrating periodic crossover of the filaments.
Figure 7C:
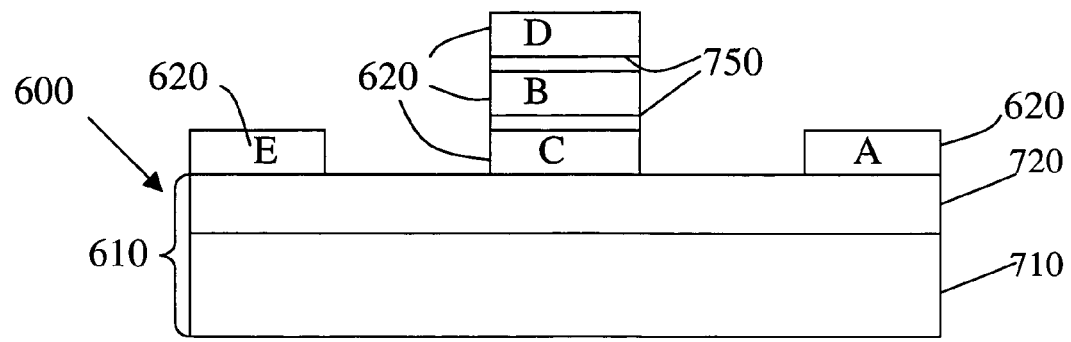
FIG. 7C is a cross-sectional view of the superconductor article of FIG. 6 taken at line 7c-7c'.

In other embodiments, a low ac loss filamentary article 600 includes filaments that are partially transposed, that is, at least one filament does not occupy every filament position. FIG. 6 is a top view of a coated article 600 having a base 610 and an array of superconducting filaments 620 extending substantially continuously along the length of the article. For the purposes of illustration, the article includes five (5) filaments, however, any number of filaments may be used in practice. The base 610 of the article 600 includes a metal substrate 710 having a textured surface and epitaxially grown buffer layer(s) 720, as illustrated in FIGS. 7A-C.

At an initial position indicated by line 7a-7a' (and illustrated in cross-section in FIG. 7A), the filaments 620 are spaced apart from one another across the width of the substrate 610 in A-B-C-D-E order. The array of filaments can have a gap in the range of about 10 to 100 µm, or for example, less than 50 µm. The filaments are typically about 50 to 1000 µm wide, or typically about 100 µm. In one or more embodiments, the filament array includes filaments of less than about 100 µm wide separated by a gap of about 10 to 20 µm. As noted previously, the gap can be an insulating air gap 730 (FIG. 7A) or can be a poorly conducting (e.g. amorphous YBCO or a conductive metal oxide), insulating or medium or high resistivity material 740 (FIG. 7B). Inclusion of a material with low conductivity in the gap allows some current sharing between filaments and can help the electrical stability of the article.

Figure 7B:
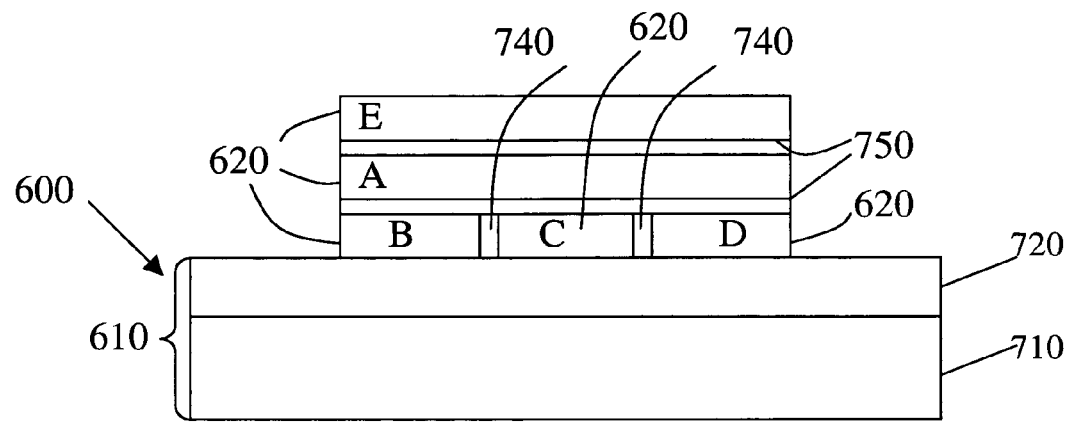
FIG. 7B is a cross-sectional view of the superconductor article of FIG. 6 taken at line 7b-7b'.
Figure 7A:
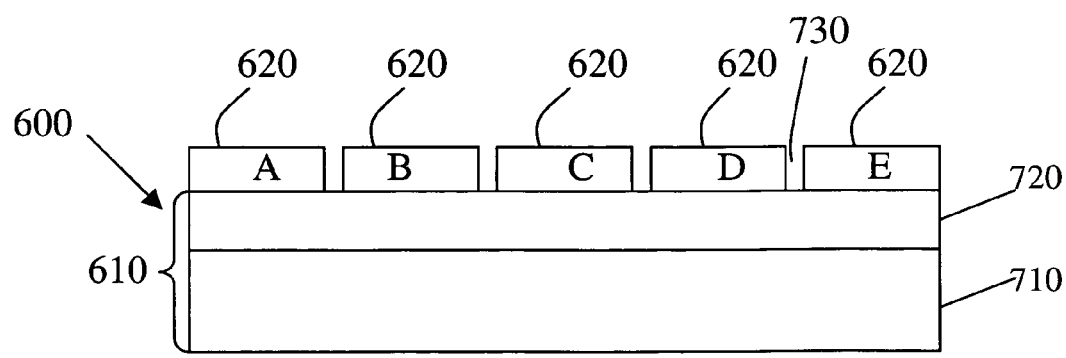
FIG. 7A is a cross-sectional view of the superconductor article of FIG. 6 taken at line 7a-7a'.

At a first crossover point indicated at line 7b-7b' in FIG. 6 and illustrated in cross-section in FIG. 7B, filament A shifted is from its position at the upper edge of the substrate over filaments B, C and D (i.e., it is shifted by a distance of four filament positions) so that filament A is located at the position previously occupied by filament E prior to the shift. Filament E is shifted is from its position at the lower edge of the substrate over filaments D, C and B (i.e., it is also shifted by a distance of four filament positions) so that filament E is located at the position previously occupied by filament A. Thus, filaments A and E have exchanged filament positions at the first crossover location. The relative positioning of filaments A and E during crossover, e.g., A over E vs. E over A, is optional.

The filaments are isolated from one another during crossover by barrier material 750. To help reduce interfilamentary coupling losses the barrier layer can be a medium to high resistivity material. Exemplary medium resistivity materials include, for example, brass, copper-aluminum bronze, copper-tin bronze, copper with around 10-40% nickel, with resistivities of around 5-40 mircroohm-cm at cryogenic temperatures. Exemplary high resistivity materials include, for example, copper with 40-50% nickel such as Constantan™, (resistivity of around 50 microohm-cm) and most commercial nickel alloys with substantial additions such as nickel-20% chromium, Hastelloy™, Inconel™, and most commercial stainless steels, with resistivities of around 100-120 microohm-cm at cryogenic temperatures. It can also be a metal oxide, for example, a metal oxide, that is doped to provide some conductivity, e.g., La(Sr)MnO$_3$, or such as barium zirconate or HTS superconductor that has been thermally decomposed or poisoned by the additional of a metal contaminant, e.g., zinc-contaminated YBCO or PrBa$_2$Cu$_3$O$_{7-x}$. La(Sr)MnO$_{3\,and}$PrBa$_2$Cu$_3$O$_{7-x}$ have the added advantage of having a lattice structure similar to that of YBCO, so that it can be textured in a manner similar to YBCO. Certain metal oxides can be deposited epitaxially and have a lattice structure similar to YBCO.

At a second crossover point indicated at line 7c-7c' in FIG. 6 and illustrated in cross-section in FIG. 7C, filament B shifted is from its initial position between filaments C and E over filament C (i.e., it is shifted by a distance of two filament positions) so that filament B is located at the position previously occupied by filament D. Filament D is shifted is from its initial position between filaments A and C over filament C (i.e., it is also shifted by a distance of two filament positions) so that filament D is located at the position previously occupied by filament B prior to the shift. Thus, filaments B and D have exchanged filament positions at the second crossover point. The relative positioning of filaments B and D during crossover, e.g., A over E vs. E over A, is optional. Barrier layer 750 separates filaments D, B and C.

After two filament crossovers, the filaments 620 are spaced apart from one another across the width of the substrate 610 in E-D-C-B-A order from the upper to the lower edge of the substrate. Thus, this filament pattern results in a filament position exchange between filament A and filament E, and a filament position exchange between filament B and filament D. Filament C's position remains unchanged, and filaments A and E do not transpose into filaments positions B and D. Thus, this configuration represents a partially transposed wire.

Figure 8:
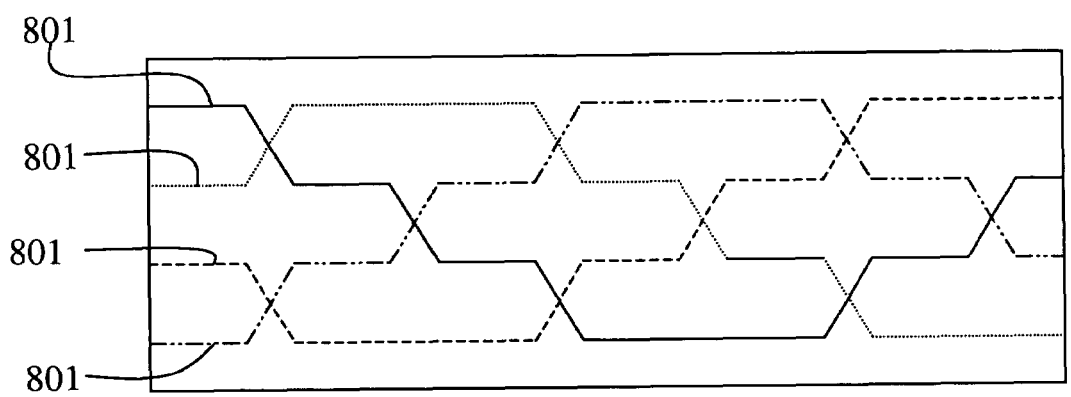
FIG. 8 is a schematic illustration of filament patterns having a periodic crossover of superconducting filaments.

Other non-limiting examples of filament patterns including at least one filament crossover are shown in FIG. 8. FIG. 8 schematically illustrates four filaments 801, 820, 803, 804 (depicted by different line forms) that shift diagonally by one filament position back and forth across the filament width. Filament pairs exchange position periodically along the elongated substrate length so as to fully transpose all filaments. As a result, the current is forced to flow in the circuitous path outlined for each of the filaments 801, 820, 803, 804. One period of full transposition for four parallel paths requires 12 crossing points. In general, for n parallel paths, the number of crossing points for one period of full transposition is n(n−1).

The number and placement of crossing points is determined, in part, by the performance of the superconducting tape at the projected operating conditions of the superconducting device and the maximum allowable ac losses. W. J. Carr calculated the loss dependence on twist pitch and transverse resistivity for a patterned thin film conductor, which was assumed to be twisted. From this model it can be concluded that the repeat distance will be in the range of 1 meter for a 60 Hz alternating magnetic field with a 0.1 T amplitude if losses are not to exceed 0.25-0.5 mW/Am, using a stabilizer with a resistivity of 50 100 microohm-cm. If the perpendicular field amplitude component as seen by the conductor is less the repeat distance can be increased proportionally. (W. J. Carr et al, "Filamentary YBCO Conductors for AC applications", IEEE Trans. Appl. Superc. 9, pp. 1475-1478, (1999).

The arrangement of filaments in a low ac loss multifilament coated HTS article is not limited to the examples described herein. Other filament patterns including at least one filament crossover will be readily apparent to one of skill in the art and are contemplated as within the scope of the invention.

The articles may further include a cap layer disposed on top of the YBCO layer and a stabilizing layer deposed on the cap layer over the patterned superconductor filaments. The cap layer is an inert protective layer that provides a physical and chemical barrier to the environment. Exemplary cap layers include noble metals, such as silver. A stabilizing layer is used to provide improved mechanical and electrical stability during use, and reduce tensile and compressive strains on the superconductor filaments. For example, a thin layer of silver can be deposited on the superconductor filaments, thereby forming a composite with the superconducting layer and enabling the lamination of a hardened copper strip by soldering onto the silver.

The multifilamentary pattern can be prepared using a variety of methods. By way of example only, patterns can be introduced into a thin film of superconducting material by abrasive milling, laser ablation, chemical etching, mechanical scribing, e-beam irradiation, ion implantation and deposition of ferromagnetic materials (iron). Abrasive milling, laser ablation, chemical etching and mechanical scribing physically remove YBCO material leaving behind a portion of the YBCO that forms the desired patterned filament structure. E-beam irradiation, ion implantation and deposition of ferromagnetic materials result in damage to exposed regions of the YBCO film transforming these regions into essentially non-superconducting material. The YBCO material that was not damaged forms the desired patterned filament structure.

A multifilament article having filament crossovers can be obtained by first patterning the superconducting layer to form filaments within the plane of a superconducting layer. The in-plane patterning can be accomplished using known techniques such as those described herein. At a crossover location, the crossover filament is stopped to allow the continuous filament to pass; the crossover filament continues in its shifted position after the crossover. The ends of the discontinuous superconducting filaments are then joined using a flexible conducting crossover element. The conducting crossover element redirects the current from the first superconducting segment, through the conducting crossover element, and into the second superconducting segment of the crossover wire.

Figure 9:
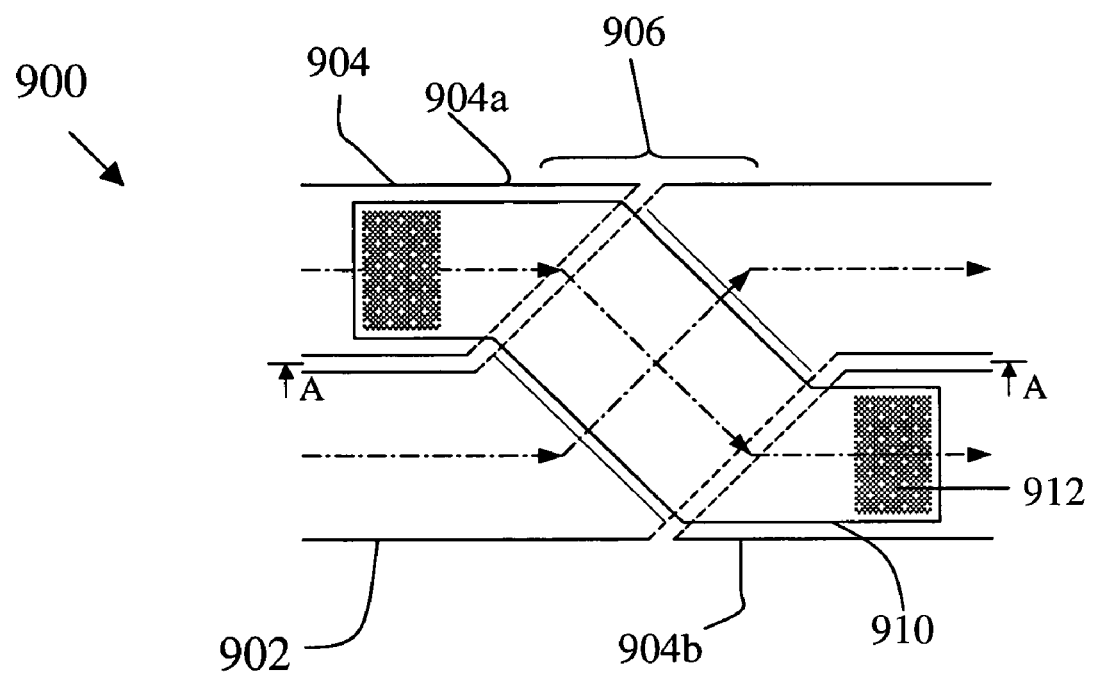
FIG. 9 is a top view of two filaments at a crossover location demonstrating the use of a conducting bridge.

A conductive crossover element 900 is illustrated in FIG. 9, which is a top view illustration of two filaments 902, 904 at a crossover location. Filament 902 is continuous at the crossover 906 and is patterned using a technique suitable for forming filaments within the plane of a superconductor layer (the method applies equally to filaments that are fabricated from a superconductor precursor). Exemplary techniques for forming the filament include scraping, sandblasting, laser ablation, e-beam irradiation, ion implantation and deposition of ferromagnetic materials. In order to form the crossover, a conducting crossover element 910 is formed between two discontinuous segments 904a and 904b of filament 904. Segment 904a is positioned on one side of the crossover and segment 904b is located on the other side of the crossover. The segment edges can be any shape, e.g., straight, irregular, curved or they can be formed at an angle, e.g., at about a 45° angle, selected to maximize superconductor coverage of the substrate while allowing switchover to occur. Conducting crossover element 910 joins the two segments 904a and 904b. The conducting element can be made of any conductive or superconductive material, and is typically made of a flexible conductive material. Suitable conductive crossover elements are preformed into a desired shape using materials such as copper or other flexible conductive material. The conductive crossover elements may be coated with an insulating or barrier layer to prevent electrical contact of the conductive bridge to the underlying filament. For example, the conducting crossover bridge can be a copper foil having a barrier layer of copper oxide. The conductive crossover element is joined to the ends of filament 904 at a bonding area 912. Exemplary bonds include solder and spot welds.

An alternative approach to the fabrication of multifilamentary articles having the configurations described herein is to use fabrication techniques that allow the building of the three-dimensional crossover structures. Three-dimensional printing is one technique that can be used to build the multiple layers of oxide superconductor and filler material at the crossover point.

The patterned filamentary superconducting oxide layer can be prepared by controlled deposition of droplets of a solution, e.g., dropwise deposition, containing precursor components to an oxide superconductor. The patterned layer is then converted into a patterned oxide superconductor. The method may be used to deposit a plurality of narrow strips of oxide superconductor in the patterns and configurations described herein in order to significantly suppress the ac loss of second generation coated conductor articles. Further information is found in copending application U.S. Ser. No. _____ TBD, entitled "Dropwise Deposition of a Patterned Oxide Superconductor," and filed on even date herewith, which is hereby incorporated in its entirety.

Precursor components to an oxide superconductor are dissolved in a suitable solvent to form a solution. A precursor component includes a metal source, e.g., a metal salt, metal compound and metal-organic compound and the like, that can be further processed (along with other precursor components) to form an oxide superconductor. The precursor components can include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. A typical precursor solution includes the salts of yttrium, barium and copper, wherein at least one of the metal salts is a trifluoroacetate. Precursor components that permit pinning centers to be introduced into superconducting thin films may also be added to the precursor solution. For example a dopant component including a metal compound having a dopant metal capable of replacing one or more of the rare earth and alkaline earth metal of the rare-earth/alkaline-earth-metal/transition metal oxide or an additive component containing one or more metal compounds capable of forming a second phase nanoparticle can be included in the precursor solution. The solvent or combination of solvents used in the precursor solution can include any solvent or combination of solvents capable of dissolving the metal sources. Such solvents include, for example, water and alcohols, including methanol, ethanol, isopropanol and butanol.

The solution is introduced into a dispensing device that has at least one nozzle through which the solution may be discharged, continuously or intermittently on demand, in the form of discrete fine droplets. The precursor solution may be dispensed through a plurality of dispensing devices and/or through a plurality of nozzles or nozzle orifices. The dispensed precursor solution is deposited onto a textured target surface essentially point by point to form a thin film in a predetermined pattern. Thus, a high degree of precision can be realized.

In one or more embodiments, an inkjet printer is used to dropwise deposit the precursor solution. Inkjet printer technology provides continuous deposition of long lengths of superconductor material on moving substrates. Any desired distribution of interfilament bridges is achievable and can be precisely applied. Both the spacing between filaments and (optionally) the distribution of bridges can be precisely controlled using computer control, as is currently employed in conventional inkjet printing. An appropriate poorly conductive or medium or high resistivity material (or other second material) is deposited in the interfilament gaps using, for example, an additional set of printer heads with a second solution. Droplets with spot sizes as small as 10 μm in the lateral dimension have been created by inkjet methods, which provides adequate interfilament resolution.

The precursor components are then heated to convert the precursors into an oxide superconductor. The precursor components are converted into an oxide superconductor by treating the precursor film to form an intermediate metal oxyfluoride film including the rare earth, the alkaline earth metal, and the transition metal of the precursor solution, and thereafter converting the oxyfluoride film into an oxide superconductor.

Figure 10:
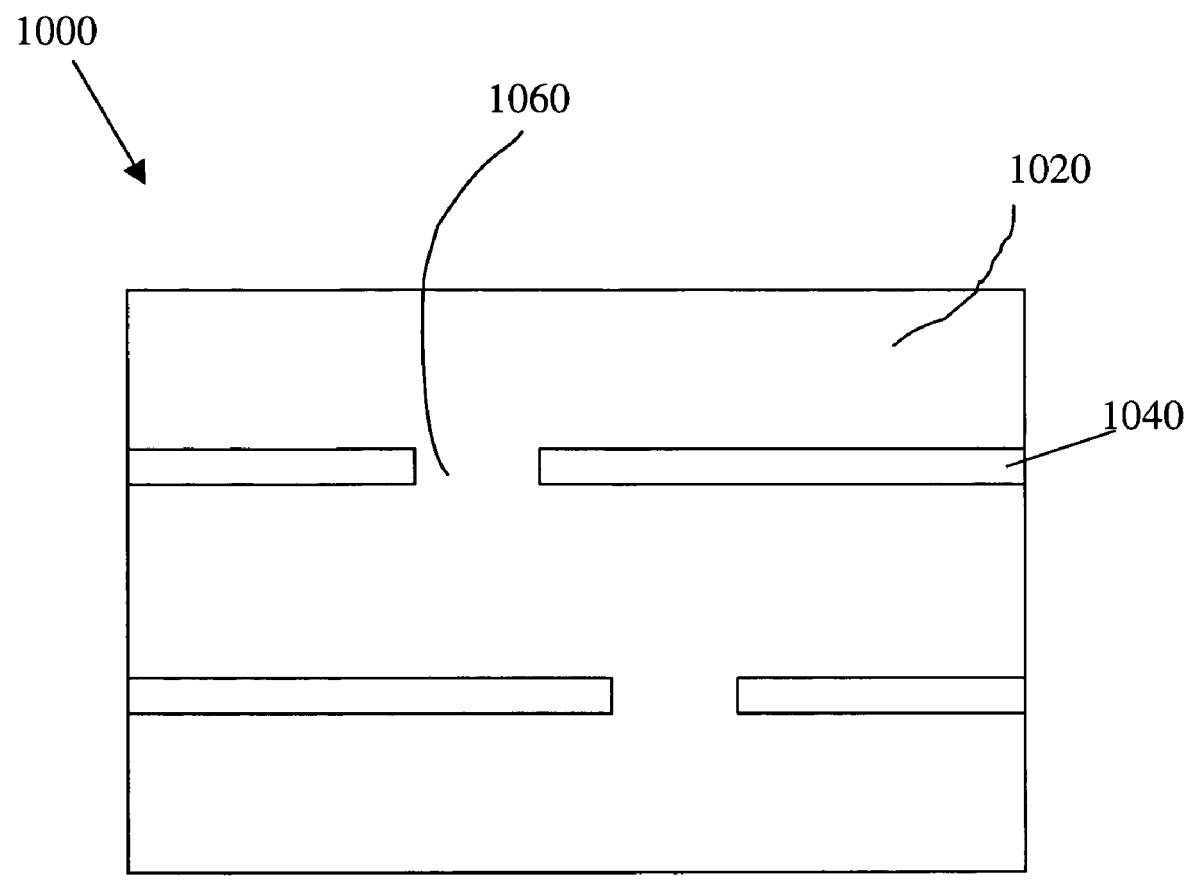
FIG. 10 is a top view of a filamentary article illustrating conductive links in the gap between filaments.

Dropwise deposition enables the method to put down material at any point on the target substrate. Thus, material can be deposited within the gaps or spacings between the filaments of the filament array. For example, additional precursor solution is deposited at random or periodic intervals to form superconducting or conductive bridges between adjacent filaments. Periodic bridges provide current continuity from filament to filament and offset defects that periodically arise in the superconducting material. Periodic bridges provide current continuity from filament to filament and offset defects that periodically arise in the superconducting material. An exemplary bridge is illustrated in FIG. 10. FIG. 10 is a top view of a coated conductor architecture 1000 having an array of continuous filaments 1020 separated by gaps 1040. The architecture includes periodic bridges 1060 that span the gap 1040. Alternatively, a second material is deposited within the gaps between filaments, such as poorly conductive material or medium or high resistivity material or precursor thereto that is selected to mechanically isolate the adjacent filaments and/or to increase electrical stability of the article.

Using multiple passes over the substrate, it is possible to form a multilayer structure at the crossover location containing the physically separated filaments. In an exemplary deposition process of two transposed wires, a first deposition step deposits droplets of superconducting precursor material to form two filaments; and filler material is deposited to fill any space not occupied by filaments. The filler material desirably is able to be textured. At the crossover junction, one filament is printed continuously and the other is interrupted. In subsequent deposition sequences, a layer of barrier material is deposited (may be the same as the filler material) over the continuous filament at the crossover junction. The barrier layer is of a thickness to provide the appropriate isolating effect between the two filaments at their closest approach and may vary in thickness, e.g., to accommodate the increased thickness of the overlapping filaments. In a final sequence of deposition steps, superconducting materials is deposited over the filler material at the crossover junction to span the bridge.

Figure 11:
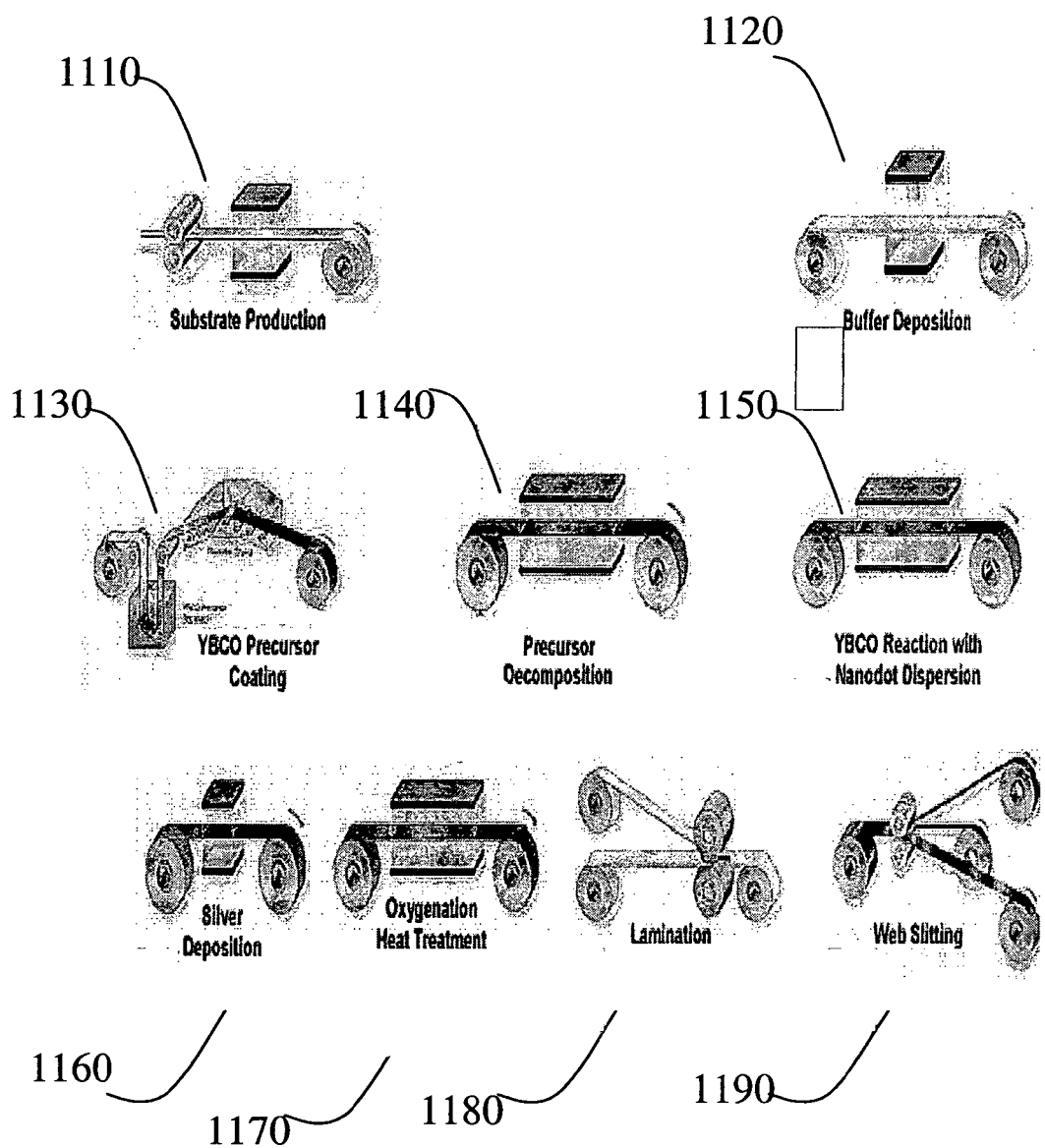
FIG. 11 is a schematic illustration of a system and process used to prepare a textured, patterned oxide superconductor wire according to one or more embodiments of the present invention.

As shown in FIG. 11, at a first station 1100, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of the surface have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a wire or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Mo, V, Ta, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1\times10^{-3}$ torr, less than about $1\times10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 1120, a buffer layer is formed on the textured substrate. The buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a patterned precursor solution is deposited deposition station 1130 as described above. Additional equipment may be required to accomplish the patterning operation, for example, when laser ablation or ion bombardment are used to pattern the superconducting layer. If dropwise patterned deposition is used, then a single station equipped with a inkjet printer deposition apparatus can accomplish both deposition and patterning of the oxide precursor solution.

At a subsequent station 1140, the precursor components are decomposed. The conversion of the patterned precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired superconductor layer at a further processing station 1150. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature at in a nominal gas environment with an oxygen pressure of about 0.05 Torr to about 150 Torr, preferably about 0.1 Torr to about 0.5 Torr and more preferably from about 0.1 Torr to about 0.2 Torr.

Further processing by noble metal deposition at station 1160, oxygen anneal at station 1070, lamination at station 1080 and slitting at station 1090 complete the process, thereby allowing for the low cost fabrication of low ac loss coated conductor wires.

The invention is described with reference to the following examples, which are provided for the purpose of illustration and are not limiting of the invention.

EXAMPLE

Design of an Exemplary Multifilamentary Coated Conductor Configuration

Consider a 4 mm-wide YBCO coated conductor tape having a critical current of 125 A (at 77 K and self field) with superconductor layer dimensions of about 4 mm by 0.001 mm. Such a dc tape is converted into an ac tape by dividing the tape into a number of parallel paths along the tape length and performing transpositions of the parallel paths at selected points.

Assuming a filament configuration as set forth in FIG. 8 with four filaments, a maximum distance between neighboring crossing points can be determined. The distance requirements for crossing points are a function of the field environment of the tape. Assume that the tape is exposed to uniform perpendicular magnetic field and the maximum voltage allowed between any two parallel paths is 1 V (e.g., the breaking voltage between the superconducting layer and the substrate). When the ac tape is exposed to a uniform perpendicular magnetic field oscillating at 50 Hz, the typical emf induced due the field change is the area times the field-time derivative. Thus, the amplitude of the induced electric field in 4-mm wide tape is about 6 mV/m for the magnetic field amplitude of 15 mT. For the maximum voltage of 1 V, the allowed tape length is 170 m and the distance $l_1$ is then about 41 m. Thus even with four parallel strips, one full transposition along the 100 m long tape in uniform (or symmetric in respect to the transpositions) perpendicular magnetic field is sufficient to reduce the ac magnetization loss by a factor of 4 to a desired value of about 0.5 mJ/m.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. patent application Ser. No. 09/579,193, filed on May 26, 2000, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. patent application Ser. No. 10/208,134, filed on Jul. 30, 2002, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same," and commonly owned U.S. patent application Ser. No. 09/615,999, filed on Jul. 14, 2000, and entitled "Superconductor Articles and Compositions and Methods for Making Same;" and U.S. Provisional Application No. 60/477,613, filed Jun. 10, 2003, and entitled "Superconductor Methods and Reactors; and U.S. Utility application Ser. No. 10/858,309, filed Jun. 4, 2004, and entitled "Superconductor Methods and Reactors," all of which are hereby incorporated by reference.

What is claimed is:

1. An article comprising:
    an elongated substrate comprising a textured surface and having a length and a width; and
    a plurality of filaments comprising an oxide superconductor extending substantially along the length of the elongated substrate and spaced apart from one other filaments across the width of the elongated substrate,
    wherein at least one filament crosses over at least one other filament such that the at least one filament occupies a first position across the width of the elongated substrate before the crossover and a second position across the width of the elongated substrate after crossover.

2. The article of claim 1, wherein the at least one filament is separated from the other filament at least at the location of crossover by an insulating or poorly conductive or medium to high resistivity material.

3. The article of claim 2, wherein the medium to high resistivity material is selected from the group consisting of copper-nickel alloy, nickel alloys and stainless steel.

4. The article of claim 1, wherein multiple filaments cross over at least one other filament to form multiple crossover locations along the length of the elongated substrate.

5. The article of claim 1, wherein the article comprises about 2 to about 100 filaments.

6. The article of claim 1, wherein the space between adjacent filaments is in the range of about 10 μm to about 100 μm.

7. The article of claim 1, wherein the space between adjacent filaments comprises an insulating or poorly conducting or medium to high resistivity material.

8. The article of claim 7, wherein the medium to high resistivity material is selected from the group consisting of copper-nickel alloy, nickel alloys and stainless steel.

9. The article of claim 7, wherein the poorly conductive material comprises amorphous rare earth-alkaline earth copper oxide or a conductive metal oxide.

10. The article of claim 1, wherein the filaments have a width of about 50 to 1000 μm.

11. The article of claim 1, wherein the distance along the length of the article between neighboring crossover locations is in the range of about 0.005 m to about 100.

12. The article of claim 1, wherein the distance along the length of the article between neighboring crossover locations is in the range of about 0.2 m to about 10 m.

13. The article of claim 4, wherein a filament at a lower filament position at a lower edge of the elongated substrate crosses over the plurality of filaments and is directed to a top filament position at an upper edge of the elongated substrate, and the remaining filaments are shifted in the opposite direction across the width of the elongated substrate by about one filament position.

14. The article of claim 13, wherein the filaments shift is repeated periodically along the length of the elongated substrate.

15. The article of claim 1, wherein a pair of filaments exchange filament positions during crossover.

16. The article of claim 15, wherein multiple filament pairs exchange filament positions periodically along the length of the elongated substrate.

17. The article of claim 1, wherein the filaments are fully transposed.

18. The article of claim 1, wherein the filaments are partially transposed.

19. The article of claim 1, wherein the filaments are located substantially in the same layer.

20. The article of claim 1, wherein the crossover comprises a conductive crossover bridge electrically connecting the at least one filament between its first and second position.

21. The article of claim 20, wherein the bridge comprises a superconductor.

22. The article of claim 20, wherein the bridge comprises a normal conductor.

23. The article of claim 20, wherein the bridge comprises a composite strip comprising a normal conductor layer and an insulating or high resistivity layer.

24. The article of claim 1, wherein the superconducting component of the filament is discontinuous and the ends of the discontinuous superconductor filament are joined by a conductive crossover bridge.

25. The article of claim 24, wherein the bridge comprises a composite strip comprising a normal conductor layer and an insulating or high resistivity layer, and the bridge is in electrical contact with the discontinuous superconductor filament.

26. The article of claim 24, wherein the bridge is bonded to each end of the discontinuous filament.

27. The article of claim 26, wherein the bond comprises a solder.

28. The article of claim 26, wherein the bond comprises a weld.

29. The article of claim 1, further comprising a cap layer disposed over the plurality of filaments.

30. The article of claim 29, further comprising a stabilizer layer disposed on the cap layer.

* * * * *